(12) United States Patent
Lin (10) Patent No.: US 10,037,937 B2
(45) Date of Patent: Jul. 31, 2018

(54) METHOD FOR FORMING SEMICONDUCTOR PACKAGE

(71) Applicant: NANYA TECHNOLOGY CORPORATION, New Taipei (TW)

(72) Inventor: Po-Chun Lin, Changhua County (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 0 days.

(21) Appl. No.: 15/866,483

(22) Filed: Jan. 10, 2018

(65) Prior Publication Data

US 2018/0130730 A1 May 10, 2018

Related U.S. Application Data

(62) Division of application No. 15/269,974, filed on Sep. 19, 2016, now Pat. No. 9,922,920.

(51) Int. Cl.

| H01L 21/4763 | (2006.01) |
|---|---|
| H01L 23/498 | (2006.01) |
| H01L 25/07 | (2006.01) |
| H01L 23/00 | (2006.01) |
| H01L 21/78 | (2006.01) |
| H01L 21/48 | (2006.01) |

(52) U.S. Cl.
CPC ...... *H01L 23/49827* (2013.01); *H01L 21/486* (2013.01); *H01L 21/4853* (2013.01); *H01L 21/78* (2013.01); *H01L 23/49838* (2013.01); *H01L 24/17* (2013.01); *H01L 25/072* (2013.01)

(58) Field of Classification Search
CPC ........... H01L 23/49827; H01L 23/5226; H01L 21/486; H01L 24/17

USPC ........................................................ 257/774
See application file for complete search history.

(56) References Cited

U.S. PATENT DOCUMENTS

| 6,762,495 B1 | 7/2004 | Reyes et al. |
|---|---|---|
| 7,005,753 B2 | 2/2006 | Seaman et al. |
| 7,277,298 B2 | 10/2007 | Ohsaka |

(Continued)

FOREIGN PATENT DOCUMENTS

| TW | 200705621 A | 2/2007 |
|---|---|---|
| TW | 201415593 A | 4/2014 |

*Primary Examiner* — Nitin Parekh
(74) *Attorney, Agent, or Firm* — CKC & Partners Co., LTD.

(57) ABSTRACT

A method of fabricating semiconductor packages includes providing an interposer layer having a first surface and a second surface opposite to the first surface, in which the interposer layer includes through interposer vias embedded inside, and the through interposer vias extended from the first surface toward the second surface, in which through interposer vias are patterned to form repetitive polygonal-packing units, and part of the through interposer vias can be grouped within at least two distinct said polygonal-packing units; subsequently, forming at least one redistribution layer on the first surface to form terminals on a surface of the redistribution layer away from the interposer layer, in which the terminals are selectively connected to the through interposer vias respectively; and then disposing at least one semiconductor chip on the redistribution layer, wherein the semiconductor chip includes active surfaces electrically connected to the terminals respectively.

10 Claims, 10 Drawing Sheets

(56) References Cited

U.S. PATENT DOCUMENTS

| | | | |
|---|---|---|---|
| 7,342,312 B2 * | 3/2008 | Komiya | H01L 23/3114 |
| | | | 257/734 |
| 7,851,929 B2 * | 12/2010 | Komiya | H01L 23/3114 |
| | | | 257/782 |
| 8,680,685 B2 | 3/2014 | Lim et al. | |
| 9,418,957 B2 | 8/2016 | Maruko | |
| 2001/0050423 A1 * | 12/2001 | Kariyazaki | H01L 23/49816 |
| | | | 257/678 |
| 2004/0017008 A1 | 1/2004 | Ueda | |
| 2005/0151242 A1 | 7/2005 | Nagata et al. | |
| 2005/0206014 A1 | 9/2005 | Sakamoto et al. | |
| 2006/0180942 A1 * | 8/2006 | Kuroda | H01L 21/563 |
| | | | 257/777 |
| 2006/0180943 A1 * | 8/2006 | Miwa | H01L 25/0657 |
| | | | 257/777 |
| 2009/0206490 A1 | 8/2009 | Koide et al. | |
| 2010/0308442 A1 | 12/2010 | Naka et al. | |
| 2012/0018885 A1 * | 1/2012 | Lee | H01L 23/481 |
| | | | 257/738 |
| 2012/0228749 A1 | 9/2012 | Pagaila et al. | |
| 2013/0168857 A1 * | 7/2013 | Gregorich | H01L 23/49827 |
| | | | 257/738 |
| 2014/0162405 A1 | 6/2014 | Liang et al. | |
| 2016/0027754 A1 | 1/2016 | Katagiri et al. | |
| 2016/0336296 A1 | 11/2016 | Jeong et al. | |
| 2017/0256466 A1 * | 9/2017 | Bishop | H01L 24/19 |

\* cited by examiner

100

S101 — Providing an interposer layer having a first surface and a second surface opposite to the first surface. Interposer layer includes through interposer vias (TIVs) embedded inside, and the through interposer vias extended from the first surface toward the second surface. The through interposer vias are patterned to form repetitive polygonal-packing units, and some of the through interposer vias are able to be grouped within at least two distinct said polygonal-packing units S102 — Forming at least one first redistribution layer on the first surface to form first terminals on a surface of the first redistribution layer away from the interposer layer, in which the first terminals are selectively connected to the corresponded through interposer vias respectively S103 — Thinning the interposer layer from the second surface, to expose ends of the through interposer vias proximal to the second surface S104 — Forming at least one second redistribution layer on the second surface to form second terminals on a surface of the second redistribution layer away from the interposer layer, in which the second terminals are routed to the first terminals through the first through silicon vias respectively.

S105 — Disposing at least one semiconductor divice on the first redistribution layer, in which the semiconductor chip includes active surfaces electrically connected to the first terminals respectively.

S106 — Disposing electrical bumps on the second terminals.

METHOD FOR FORMING SEMICONDUCTOR PACKAGE

PRIORITY CLAIM AND CROSS-REFERENCE

The present application is a Divisional Application of U.S. application Ser. No. 15/269,974, filed Sep. 19, 2016, which is incorporated herein by reference in its entirety.

BACKGROUND

The present disclosure relates to a semiconductor package and a method of fabricating a semiconductor package.

DESCRIPTION OF RELATED ART

With semiconductor packaging, the semiconductor product could be more compactly integrated, and provide a better performance with greater miniaturization. As a consequence, methods for fabricating semiconductor packages, such as wire bonding, flip chip, and wafer level packaging, are developed to fulfill different demands. Some of the methods for fabricating semiconductor packages may adopt interposer layers with a customized connection configuration to assemble the semiconductor packages. However, the customized connection configuration of the interposer layers would be re-designed in every semiconductor packages, and demands corresponding photomasks to fabricate. To some extent, every semiconductor packages needs a different photomask for fabricating the interposer layers. As a consequence, the photomasks may greatly increase the cost of fabricating different semiconductor packages. Therefore, the fabrication of the semiconductor packages and the available structure of semiconductor packages, as described above, apparently exist inconvenience and defect, which needs further improvement. To deal with the aforesaid problem, practitioners of ordinary skill in the art have striven to attain a solution, and the problem still lacks a suitable solution to be developed. Therefore, to deal with the aforesaid problem effectively is an important subject of research and development, and also a desired improvement in the art.

SUMMARY

The present disclosure provides a method for forming semiconductor packages. The method includes: providing an interposer layer having a first surface and a second surface opposite to the first surface, in which the interposer layer includes through interposer via (TIVs) embedded inside, and the through silicon vias extended from the first surface toward the second surface, in which through interposer vias are patterned to form repetitive polygonal-packing units, and part of the through interposer vias can be grouped within at least two distinct said polygonal-packing units; subsequently, forming at least one redistribution layer on the first surface to form terminals on a surface of the redistribution layer away from the interposer layer, in which the terminals are selectively connected to the through interposer vias respectively; and then disposing at least one semiconductor chip on the redistribution layer, wherein the semiconductor chip includes active surfaces electrically connected to the terminals respectively.

The present disclosure provides a semiconductor package. The semiconductor package includes an interposer layer, at least one first redistribution layer, at least one second redistribution layer, at least one semiconductor chip, and electrical bumps. The interposer layer, having a first surface and a second surface opposite to the first surface, includes through interposer vias embedded inside. The through interposer vias are extended from the first surface toward the second surface. The through interposer vias are patterned to form repetitive polygonal-packing units, in which part of the through interposer vias can be grouped within at least two distinct said polygonal-packing units. The first redistribution layer, disposed on the first surface, includes first terminals formed on a surface of the first redistribution layer away from the interposer layer, in which the first terminals are selectively connected to the first through interposer vias respectively. The second redistribution layer, disposed on the second surface, includes second terminals formed on a surface of the second redistribution layer away from the interposer layer, in which second terminals are connected to the first terminals through the first through interposer vias respectively. The semiconductor chip, disposed on the first redistribution layer, has active surfaces. The active surfaces are electrically connected to the first terminals respectively. The electrical bumps are disposed on the second terminals.

It is to be understood that both the foregoing general description and the following detailed description are by examples, and are intended to provide further explanation of the invention as claimed.

BRIEF DESCRIPTION OF THE DRAWINGS

The disclosure can be more fully understood by reading the following detailed description of the embodiment, with reference made to the accompanying drawings as follows.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION

Reference will now be made in detail to the present embodiments of the invention, examples of which are illustrated in the accompanying drawings. Wherever possible, the same reference numbers are used in the drawings and the description to refer to the same or like parts.

It will be understood that when an element is referred to as being "on", "over" another element, it can be directly on the other element or intervening elements may be present therebetween. In contrast, when an element is referred to as being "directly on" another element, there are no intervening elements present.

Figure 1:
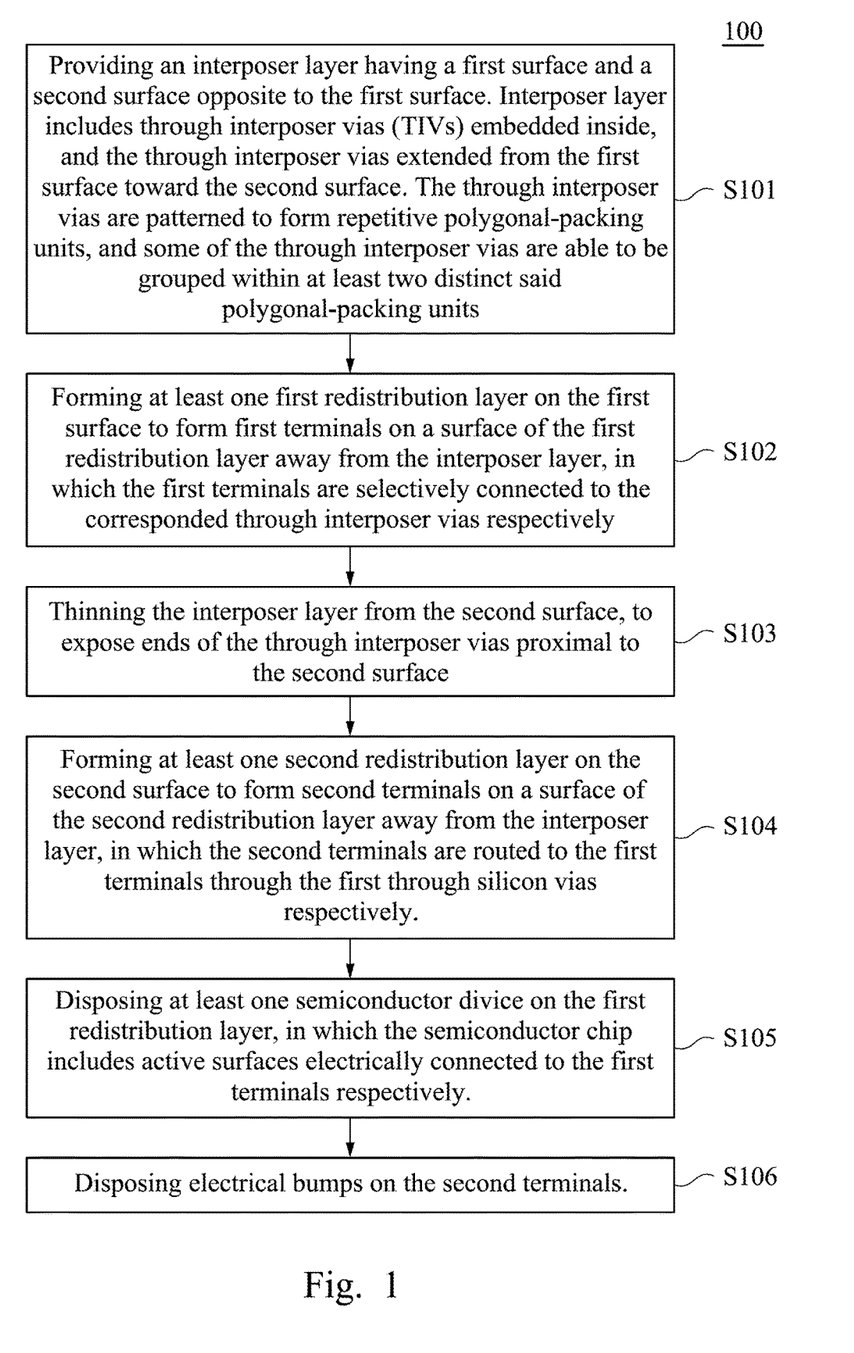
FIG. 1 is a flowchart illustrating a method for fabricating semiconductor packages according to an embodiment of the present disclosure.

Reference is made to FIG. 1. FIG. 1 illustrates a flowchart of a method 100 for fabricating semiconductor packages according to an embodiment of the present disclosure. As shown in FIG. 1, the method 100 begins with step S101 in which an interposer layer is provided. The interposer layer, having a first surface and a second surface opposite to the first surface, includes through interposer vias (TIVs) embedded inside. Conductive material can be filled into the through interposer vias to form conductive paths for further electrically connection. The through interposer vias are extended from the first surface toward the second surface; and moreover, the through interposer vias are grouped and patterned to form polygonal-packing units. In some embodiments, the polygonal-packing units can be formed repetitively, and one of the polygonal-packing units can be partially overlapped with at least one another polygonal-packing unit. In some embodiments, the through interposer vias can be grouped and patterned to form hexagonal-packing units (referring to FIG. 2). In other embodiments, the through interposer vias can be grouped and patterned to form square-packing units (referring to FIGS. 10A-10D). In other embodiments, the through interposer vias can be grouped and patterned to form closed-packing units, in which the through interposer vias can form densely to occupy most area of the interposer layer and adapt various arrangement. In some embodiments, part of the through interposer vias can be grouped within at least two distinct polygonal-packing units. More specifically, the through interposer vias which are not located at the fringe or corner of all the through interposer vias can be enclosed within at least two distinct polygonal-packing units (referring to FIG. 2).

It should be noted that, the polygonal-packing unit and the through interposer vias, drawn herein, is only an exemplary, and not intended to limit the present disclosure. In some embodiments, borders of a polygonal-packing unit may be formed by the outline enclosing a group of through interposer vias. In other embodiments, borders of a polygonal-packing unit may be formed by connecting the centers of through interposer vias within a group. In some embodiments, diameters of each of the through interposer vias within a group can be spreading instead of single-sized through interposer vias. For example, through interposer vias may have two or more different diameters, and a polygonal-packing unit can be formed repetitively with the spreading-sized through interposer vias. In some embodiments, length of each borders of a polygonal-packing unit can also be varied. It should be understood that the polygonal-packing unit and the through interposer vias, described herein, could be adjusted to actual demand by those skilled in the art, without departed from the scope or the spirits of the present disclosure. That is, the prerequisite of the through interposer vias is formed to provide adequate conductive routes for connecting between semiconductor devices and electrical bumps.

Subsequently, the method 100 continues with step S102 in which at least one first redistribution layer are formed on the first surface of the interposer layer. The first redistribution layer includes first conductive routes formed and embedded inside the substrate of the first redistribution layer. One end of some of the first conductive routes may be connected to one of the through interposer vias, and another end of the said first conductive routes may be exposed on a surface of the first redistribution layer away from the interposer layer to form first terminals. On the other hand, the first terminals are formed on the surface of the first redistribution layer away from the interposer layer, and the first terminals are selectively connected or routed to the through interposer vias respectively. The first terminals are configured to be electrically connected to the semiconductor device, for example, semiconductor chips, semiconductor package . . . etc.

Subsequently, the method 100 continues with step S103 in which the interposer layer is thinned from the second surface, to expose ends of the through interposer vias proximal to the second surface. In other embodiments, the ends of the through interposer vias proximal to the second surface can be exposed while the interposer layer is provided. Subsequently, the method 100 continues with step S104 in which at least one second redistribution layer is formed on the second surface. The second redistribution layer includes second conductive routes formed and embedded inside the substrate of the first redistribution layer. One end of some of the second conductive routes are connected to one of the through interposer vias connected with the first conductive routes, and another end of the second conductive routes are exposed on a surface of the second redistribution layer away from the interposer layer to form second terminals. On the other hand, the second terminals are formed on the surface of the second redistribution layer away from the interposer layer, and the second terminals are selectively routed to the first terminals through the through interposer vias respectively.

Subsequently, the method 100 continues with step S105 in which at least one semiconductor device, for example, semiconductor chip, is disposed on the first redistribution layer. The semiconductor device may include active surfaces, and the active surfaces can be electrically connected to the first terminals respectively. Subsequently, the method 100 continues with step S106 in which electrical bumps can be disposed on the second terminals for being electrically connected to the corresponding semiconductor device.

Owing to the interposer layer provided in method 100 includes the through interposer vias designed to fit all connection configurations, any semiconductor packages can be fabricated by adopting the interposer layer. More specifically, while the interposer layer is adopted, conductive routes connected between the first terminals and the corresponding second terminals can be established through the through interposer vias of the interposer layer respectively; and moreover, the semiconductor devices can be electrically connected to the corresponding electrical bumps through the first terminals and the second terminals. In other words, the size of an opening formed on the first redistribution layer exposing the first terminals, or the contact pad formed on the opening, can be adjusted for actual demands, such that the through interposer vias can be adopted for electrically connected to various-sized pads in different semiconductor devices. Therefore, the through interposer vias of the interposer layer and collaborated redistribution layers may provide the method 100 a greater compatibility and feasibility for adapting various sizes of different semiconductor devices and bumps, and even, spreading locations of the disposed semiconductor devices and bumps can also be adapted. Furthermore, owing to the interposer layer only needs a single photomask to fabricate compared to using different customized photomasks in different cases, the method 100 employed the one-fit-all interposer layer instead of customized interposer layers may save the cost of the fabrication.

In addition, owing to the material of the through interposer vias has a greater mechanical strength compared to the material of the substrate formed the interposer layer, the through interposer vias may enhance the interposer layer. As a consequence, the interposer layer embedded inside the semiconductor packages can assist the semiconductor packages to resist force-induced warpage. Furthermore, the through interposer vias patterned regularly to form repetitive polygonal-packing units can avoid or prevent inhomogeneous distribution of the through interposer vias from generating unbalance force to induce warpage.

In some embodiments, the method 100 may further include bonding the electrical bumps onto a packaging substrate, to form semiconductor packages. In some embodiments, the method 100 may further include singulating the semiconductor packages. The semiconductor packages are singulated along predetermined scribe lines. In some embodiments, the scribe lines may cut across the through interposer vias. In some embodiments, the through interposer vias being cut may be the through interposer vias disconnected with the first terminals and second terminals.

Figure 2:
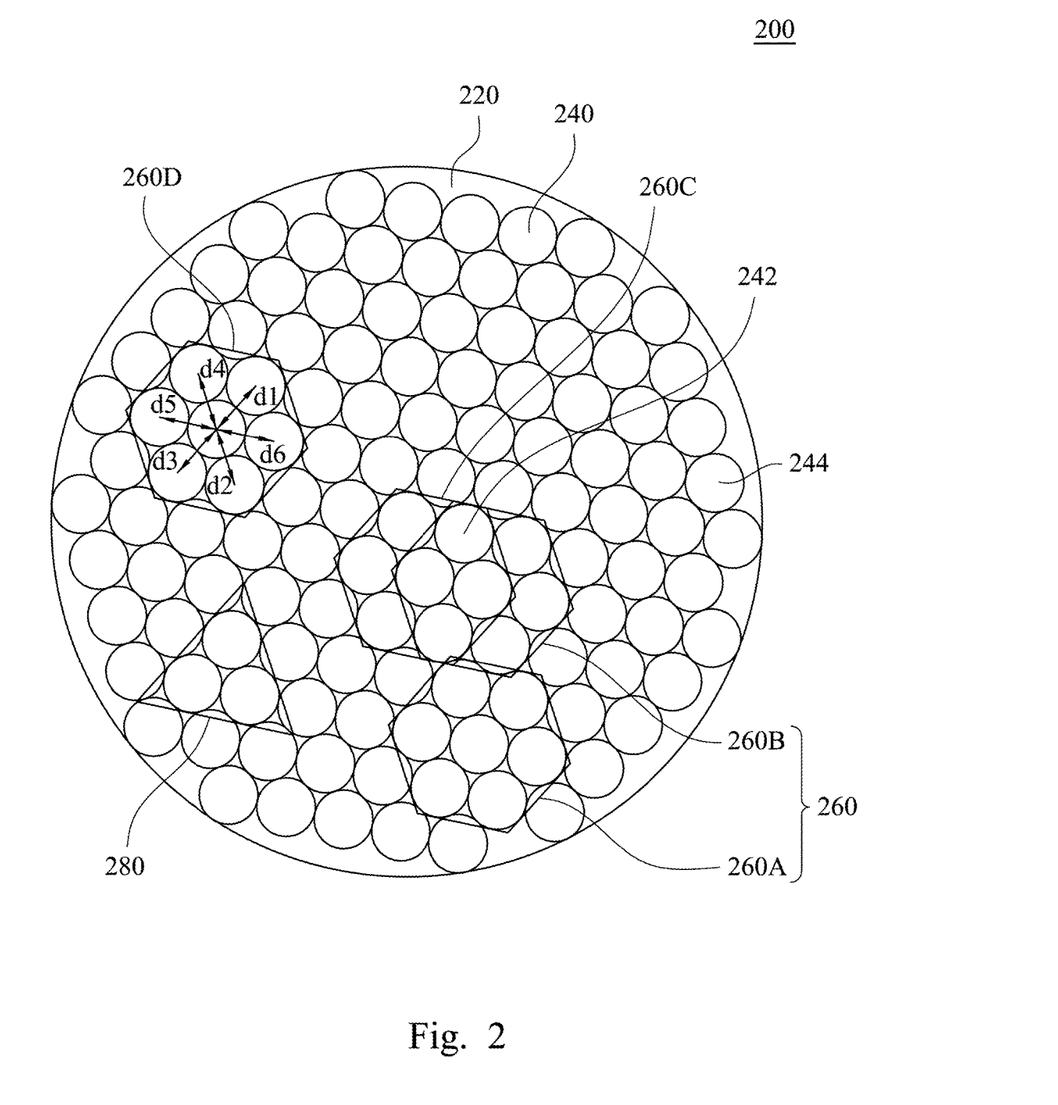
FIG. 2 is a top view of an interposer layer according to an embodiment of the present disclosure.

Reference is then made to FIGS. 2-8. FIG. 2 illustrates a top view of an interposer layer 200 according to an embodiment of the present disclosure. FIG. 3 to FIG. 8 illustrate simplified fragmentary cross-sectional views of a semiconductor package 300 at various stages according to some embodiments of the present disclosure. Referring to FIG. 2, the interposer layer 200 includes a substrate 220 and through interposer vias 240 embedded inside the substrate 220. The through interposer vias 240 can be grouped and patterned to form polygonal-packing units 260, for example, the polygonal-packing unit 260A, 260B, 260C . . . etc. In some embodiments, the polygonal-packing units 260 can be formed repetitively. At least one of the polygonal-packing units 260 is partially overlapped with at least one another polygonal-packing unit 260. For example, the polygonal-packing unit 260B is partially overlapped with the polygonal-packing unit 260C. On the other hand, in some embodiment, the through interposer vias 240 can be sorted as non-fringe through interposer vias 242 and fringe through interposer vias 244, and each of the non-fringe through interposer vias 242 can be grouped within at least two distinct polygonal-packing units 260. For example, a non-fringe through interposer via 242 grouped within the polygonal-packing unit 260B can also be grouped within the polygonal-packing unit 260C.

Figure 3:
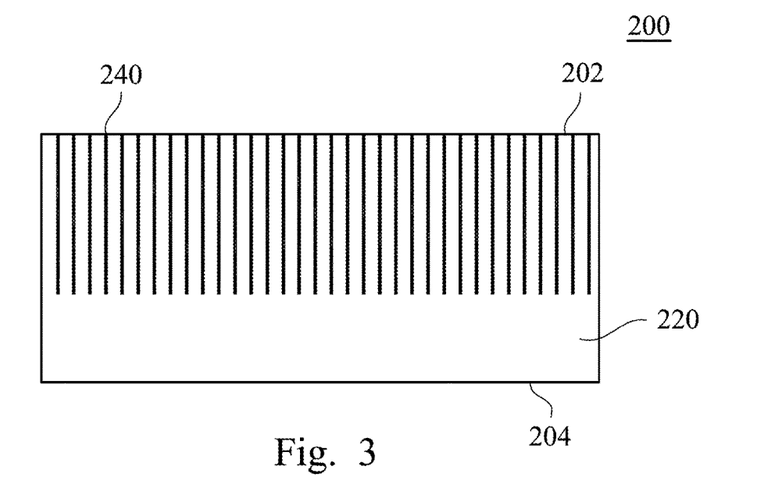
FIG. 3 to FIG. 8 are simplified fragmentary cross-sectional views of a semiconductor package at various stages according to an embodiment of the present disclosure.

Reference is then made to FIG. 3, which may correspond to step S101. As shown in FIG. 3, the interposer layer 200 has a first surface 202 and a second surface 204 opposite to the first surface 202. In some embodiments, the through interposer vias 240 are extended from the first surface 202 toward the second surface 204. Ends of the through interposer vias 240 proximal to the second surface 204 may be covered firstly, and then the ends can be exposed in subsequent processes. In other embodiments, the ends of the through interposer vias 240 proximal to the second surface 204 can be exposed while the interposer layer 200 is provided.

Figure 4:
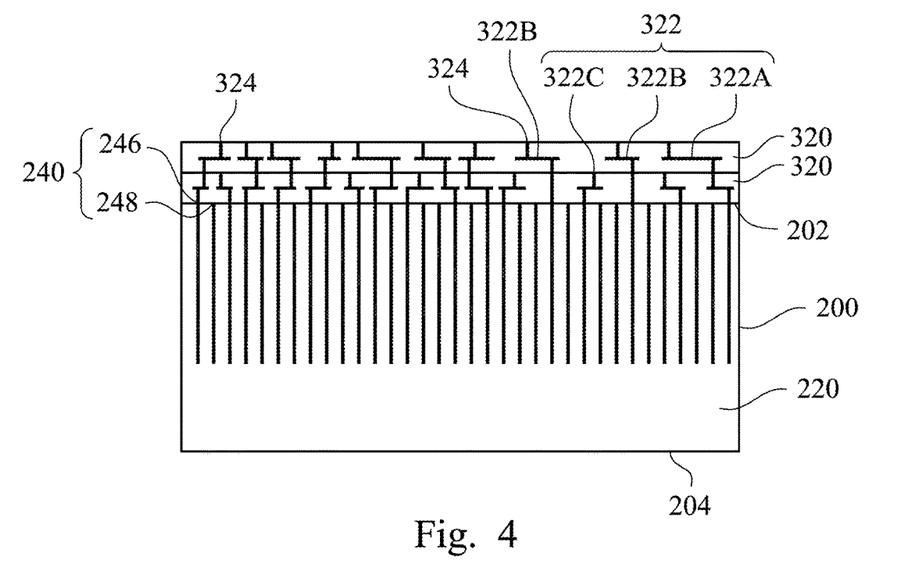

Reference is then made to FIG. 4, which may correspond to step S102. As shown in FIG. 4, at least one first redistribution layer 320 can be formed on the first surface 202. In some embodiments, first conductive routes 322 can be formed in the first redistribution layer 320. More specifically, in some embodiments, the first redistribution layer 320 can be formed in the manner that forming the first conductive routes 322 on at least one substrate layer having opening exposed underlying conductive feature, such as the through interposer vias 240, and another substrate can be formed with an opening to expose the first conductive routes 322 on different location for further bonding. The substrate can be formed by passivation material or dielectric material. One end of the first conductive route 322 may be connected to one of the through interposer vias 240, and another end of the first conductive route 322 can form first terminals 324 on a surface of the first redistribution layer 320 away from the interposer layer 200. Therefore, the first through interposer vias 240 can be sorted into selected through interposer vias 246 connected with the first terminals 324, and unselected through interposer vias 248 covered by the first redistribution layer 320. On the other hand, each of the through interposer vias 240 can be configured to be a selected through interposer via 246 or an unselected through interposer via 248 firstly, and then selectively routing the selected through interposer vias 246 to first terminals 324 through the first redistribution layer 320 respectively.

In some embodiments, the semiconductor packages 300 may include first redistribution layers 320. The selected through interposer vias 246 routed to the first terminals 324 can be picked through different layer of the first redistribution layers 320. For example, a selected through interposer vias 246 can be routed through the first conductive route 322A, routed in each of the first redistribution layers 320. For example, another selected through interposer vias 246 can be routed through the first conductive route 322B, routed from another layer of the first redistribution layers 320. For example, an unselected through interposer vias 246 can be blocked while the first conductive route 322C is ended up within the first redistribution layers 320. It should be noted that, the conductive routes formed between the first terminals 324 and the through interposer vias 240, described herein, is only an exemplary, and not intended to limit the present disclosure.

Figure 5:
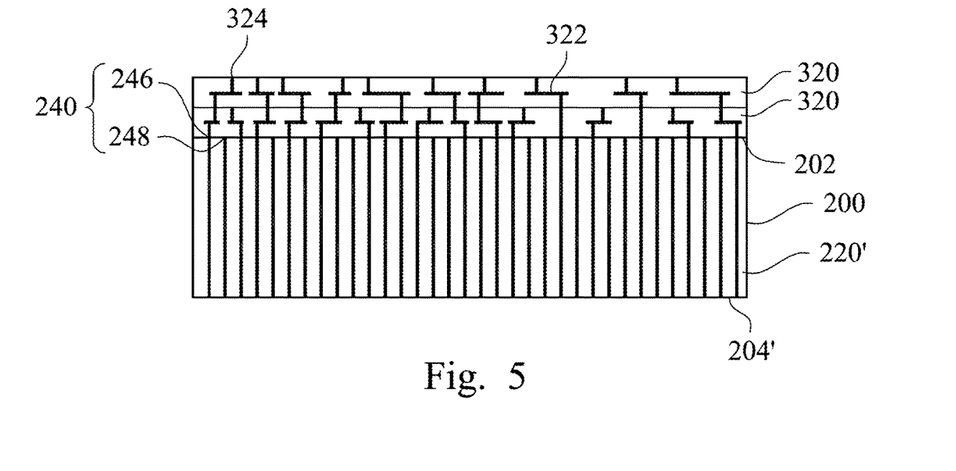
Figure 6:
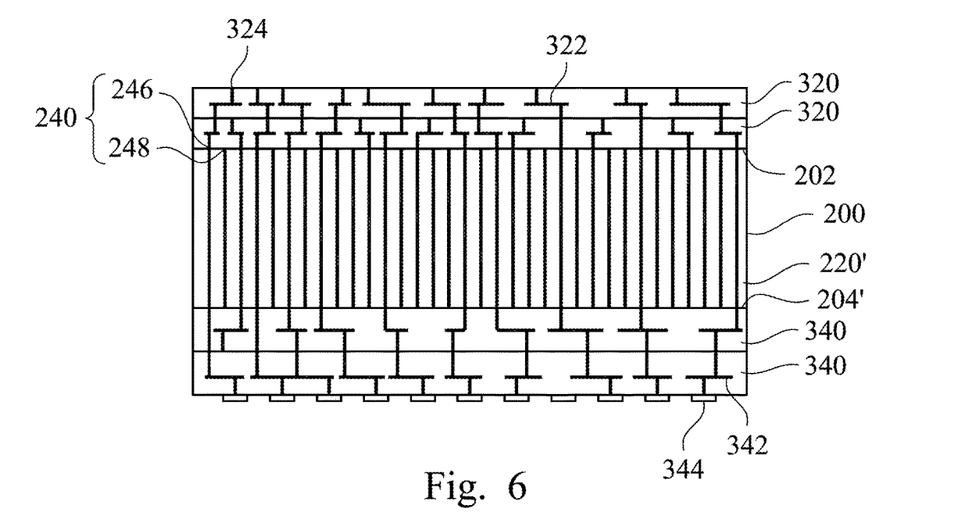

Reference is then made to FIG. 5 and FIG. 6, which may correspond to steps S103, S104 respectively. As shown in FIG. 5, the interposer layer 200 may be thinned from the second surface 204, to expose ends of the through interposer vias 240 on the second surface 204'. Subsequently, as shown in FIG. 6, at least one second redistribution layer 340 can be formed beneath the second surface 204'. In some embodiments, second conductive routes 342 can be formed inside the second redistribution layer 340. In some embodiments, one end of the second conductive route 342 can be connected to one of the through interposer vias 240 connected with the first terminal 324, such as a selected through interposer vias 246. Another end of the second conductive route 342 can form second terminals 344 on a surface of the second redistribution layer 340 away from the interposer layer 200. On the other hand, each of the second terminals 344 can be routed to the first terminals 324 through the selected through interposer vias 246 respectively Referring to FIG. 7 and FIG. 8, which may correspond to steps S105, S106. Electrical bumps 350 can be disposed on the second terminals 344. In some embodiments, at least one semiconductor device 360 can be disposed on the first terminals 324. In some embodiments, the semiconductor device 360 may be a semiconductor chip or a semiconductor package . . . etc. In some embodiments, the semiconductor device 360 may have active surfaces 362. The active surfaces 362 of the semiconductor device 360 can be electrically connected to the first terminal 324 through the conductive columns 364. As a consequence, the semiconductor device 360 can be electrically connected to the electrical bumps 350 through conductive routes formed between the first terminals 324 and the second terminals 344, such as the first conductive routes 322, the through interposer vias 240, and the second conductive routes 342 . . . etc. In some embodiments, a packaging substrate 370 can be bonded to the electrical bumps 350, to form the semiconductor packages 300.

Figure 7:
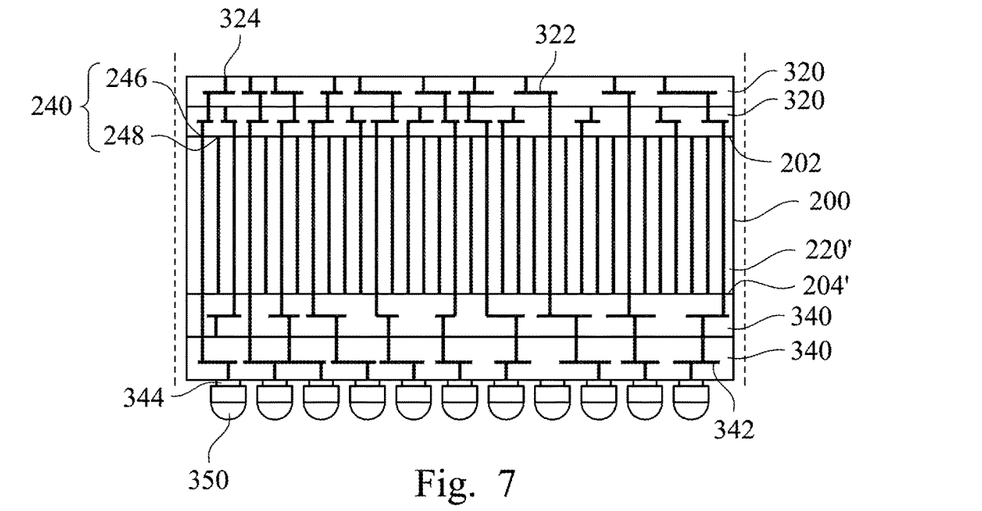
Figure 8:
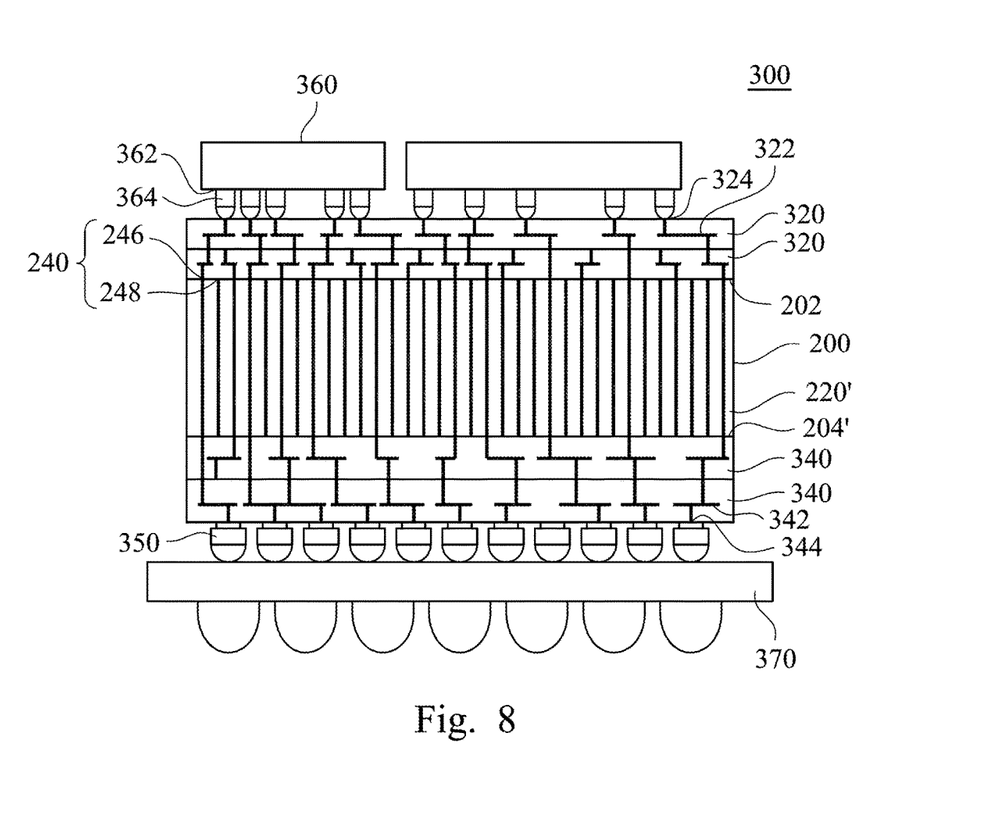
Figure 9:
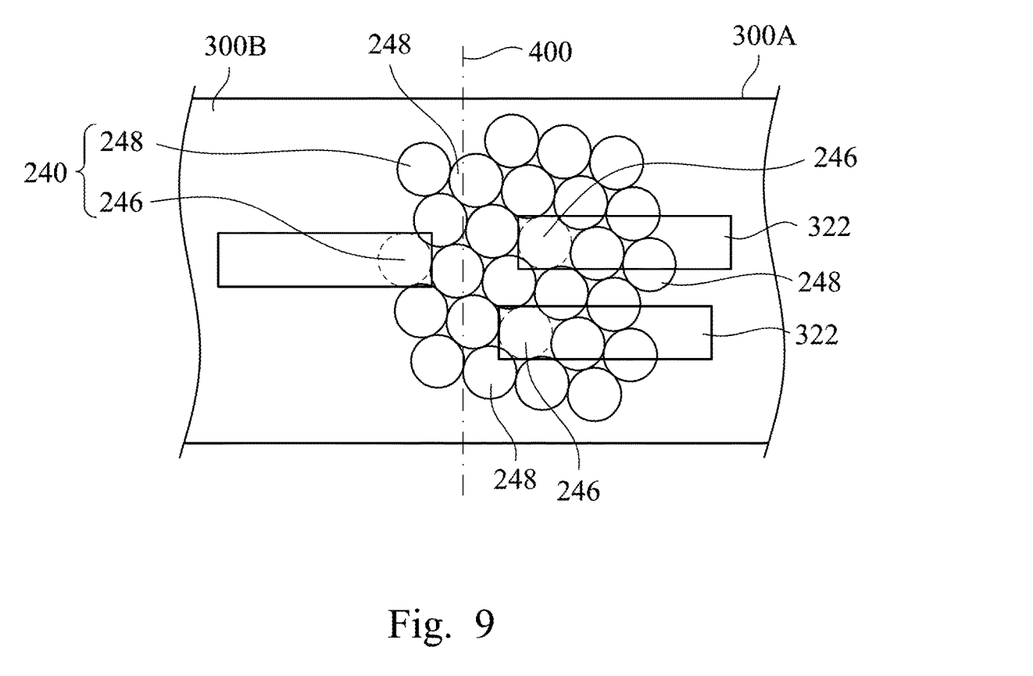
FIG. 9 is a simplified fragmentary top view of semiconductor packages according to an embodiment of the present disclosure.

Reference is made to FIG. 9. FIG. 9 illustrates a simplified fragmentary top view of semiconductor packages 300A, 300B according to various embodiment of the present disclosure, in which the dotted-line circles represent selected through interposer vias 246 electrically connected to first conductive routes 322, and the solid line circles represent unselected through interposer vias 248. As shown in FIG. 9, a saw street 400 for singulating the semiconductor packages 300A, 300B, is located between the semiconductor package 300A and semiconductor package 300B. In some embodiment, the saw street 400 may trespass and cut through the unselected through interposer vias 248 to split the unselected through interposer vias 248 into at least two parts, and avoid the first conductive routes 322 and the selected through interposer vias 246 from being cut. Therefore, while the semiconductor packages 300A, 300B being separated along the saw street 400, the first conductive routes 322 and the selected through interposer vias 246 can remain intact and functioning. Referring to FIG. 7, in some embodiment, the semiconductor package can also be singulated from an area without the first conductive routes 322, the second conductive routes 342 and the through interposer vias 240.

Referring to FIG. 2, in some embodiments, the through interposer vias 240 are substantially equal to each other, such as size, diameter, radius of curvature of the through interposer vias 240 are substantially equal. In some embodiments, a distance between the geometric center of a through interposer via 240 and an adjacent one of the surrounding through interposer vias 240 can be a substantially constant. That is, a distance between the geometry center of a through interposer via 240 to a geometry center among the surrounded and closest through interposer vias 240 is substantially equal to a distance between the geometry center of the through interposer via 240 to another geometry center among the surrounded and closest through interposer vias 240. For example, as shown in the hexagonal-packing unit 260D, each of distances d1, d2, d3, d4, d5, d6 may represent distance between the geometric center of the centered through interposer via 240 to a geometric center of one of the surrounded through interposer vias 240, such that distances d1, d2, d3, d4, d5, d6 can be substantially equal. Therefore, the through interposer vias 240 can form polygonal-packing units. For example, the through interposer vias 240 may form hexagonal-packing units 260A, 260B, 260C and 260D.

In addition, in some embodiment, the hexagonal-packing units 260 can be fabricated in the manner that duplicating one of the hexagonal-packing units 260A, 260B, 260C, and 260D repetitively. In other embodiments, the hexagonal-packing units 260 can be fabricated in the manner that duplicating a repetitive element 280 of the hexagonal-packing units 260 repetitively.

Figure 10A:
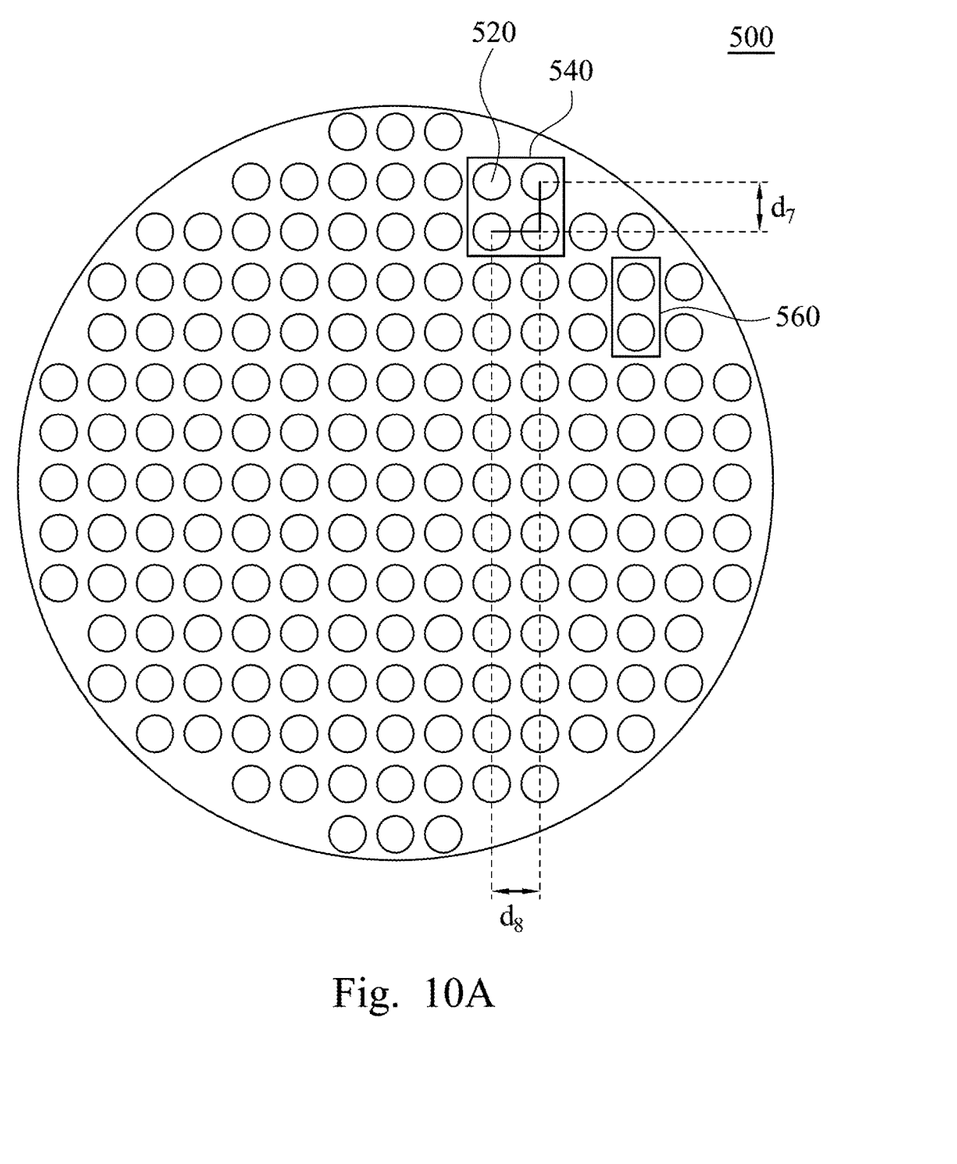
FIG. 10A to FIG. 10D are top views of an interposer layer according to various embodiments of the present disclosure.

Reference is then made to FIGS. 10A-10D. FIG. 10A to FIG. 10D are top views of an interposer layer 500, 600, 700 and 800 according to various embodiments of the present disclosure. As shown in FIG. 10A, in some embodiments, the through interposer vias 520 may form a rectangle-packing unit 540. In some embodiment, distances d7, d8 measured from the geometric center of a through interposer via 520 to the geometric centers of the surrounded and closest through interposer vias 520, formed on the interposer layer 500, can be adjusted to fulfill various demands. For example, in some embodiments, the distance d7 can be differed from the distance d8. In other embodiments, the distances d7, d8 can be substantially equal. In other words, the closest distances between any two adjacent through interposer via 520 can be substantially equal. That is, the rectangle-packing unit 540 can be a square-packing unit in some cases. In some embodiment, the through interposer vias 520 of the interposer layer 500 can be fabricated in the manner that duplicating the rectangle-packing unit 540, or otherwise, a repetitive element 560 of the rectangle-packing units 540 repetitively and side by side.

Figure 10B:
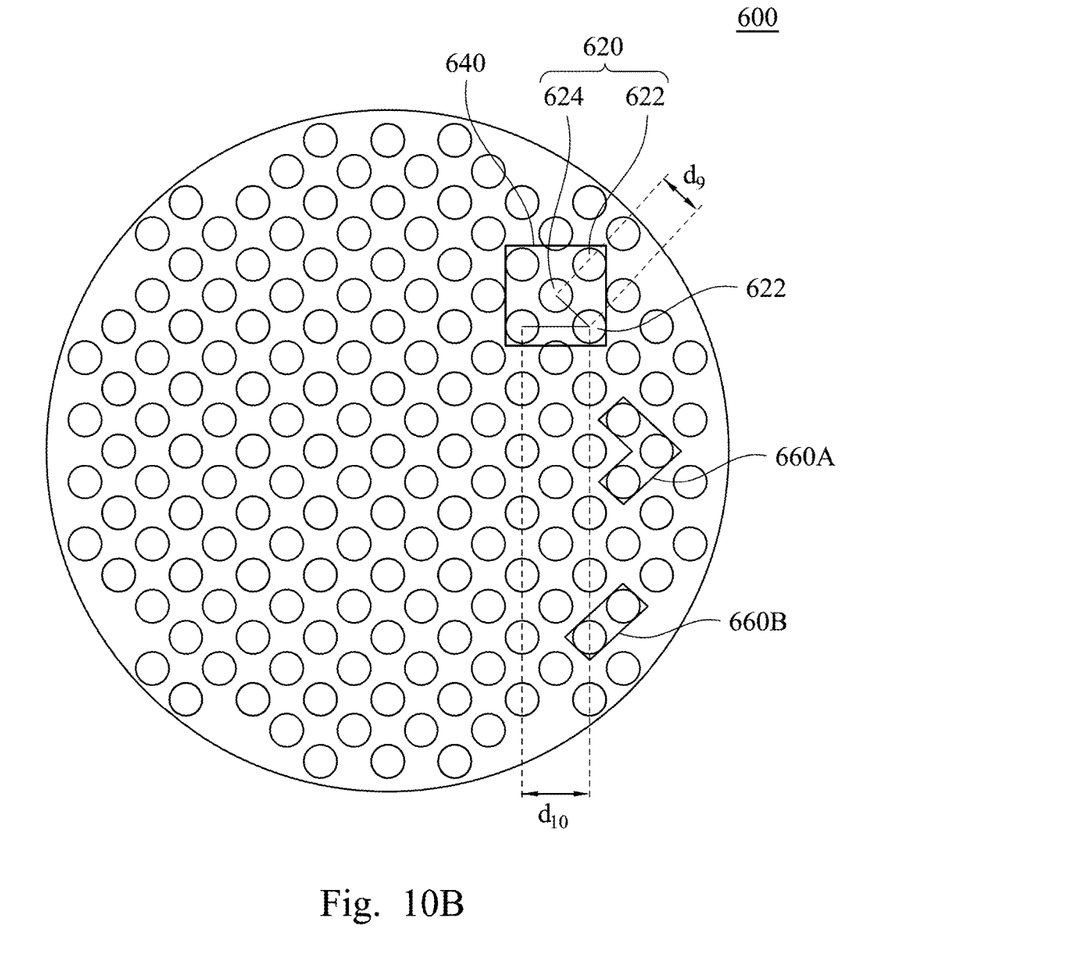

Referring to FIG. 10B, in some embodiments, the through interposer vias 620 may form a square-packing unit 640 on the interposer layer 600. Each of the square-packing unit 640 may include corner through interposer vias 622 and a center through interposer via 624 formed at center of the square-packing unit 640. It should be noted that a center through interposer via 624 can also be a corner through interposer via 622 in another square-packing unit 640. In some embodiments, distance d9 between a center through interposer via 624 to the surrounded and closest corner through interposer vias 622 are substantially equal. In some embodiment, the through interposer vias 620 of the interposer layer 600 can be fabricated in the manner that duplicating the square-packing unit 640, repetitive elements 660A, and/or repetitive elements 660B repetitively and side by side.

Figure 10C:
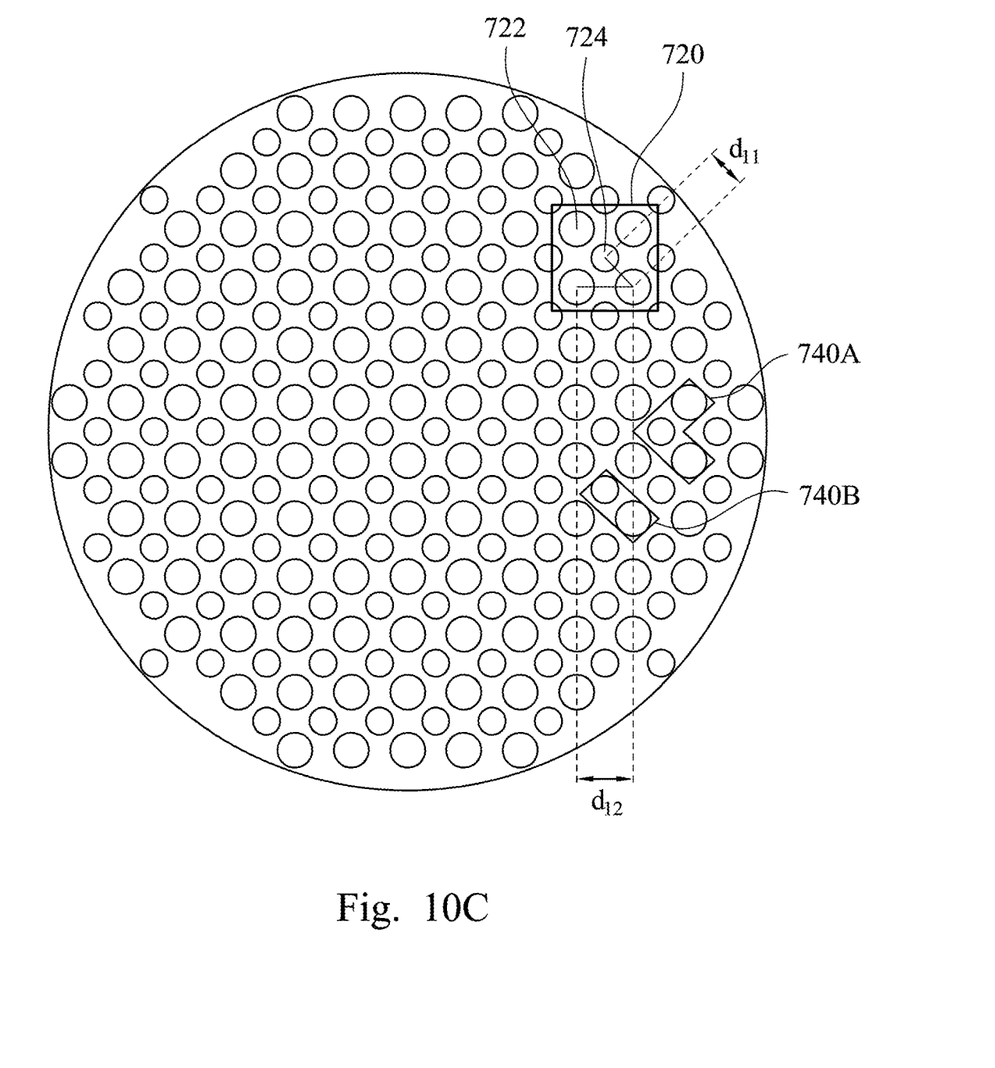

Referring to FIG. 10C, in some embodiments, the through interposer vias 720 may form a square-packing unit 740 on the interposer layer 700. Each of the square-packing unit 740 may include corner through interposer vias 722 and a center through interposer via 724 formed at center of the square-packing unit 740. Diameter of the corner through interposer vias 722 and diameter of the center through interposer via 724 are distinct. In some embodiments, the diameter of the corner through interposer vias 722 may be greater than the diameter of the center through interposer via 724. In some embodiment, the through interposer vias 720 of the interposer layer 700 can be fabricated in the manner that duplicating the square-packing unit 740, repetitive elements 760A, and/or repetitive elements 760B repetitively and side by side.

Figure 10D:
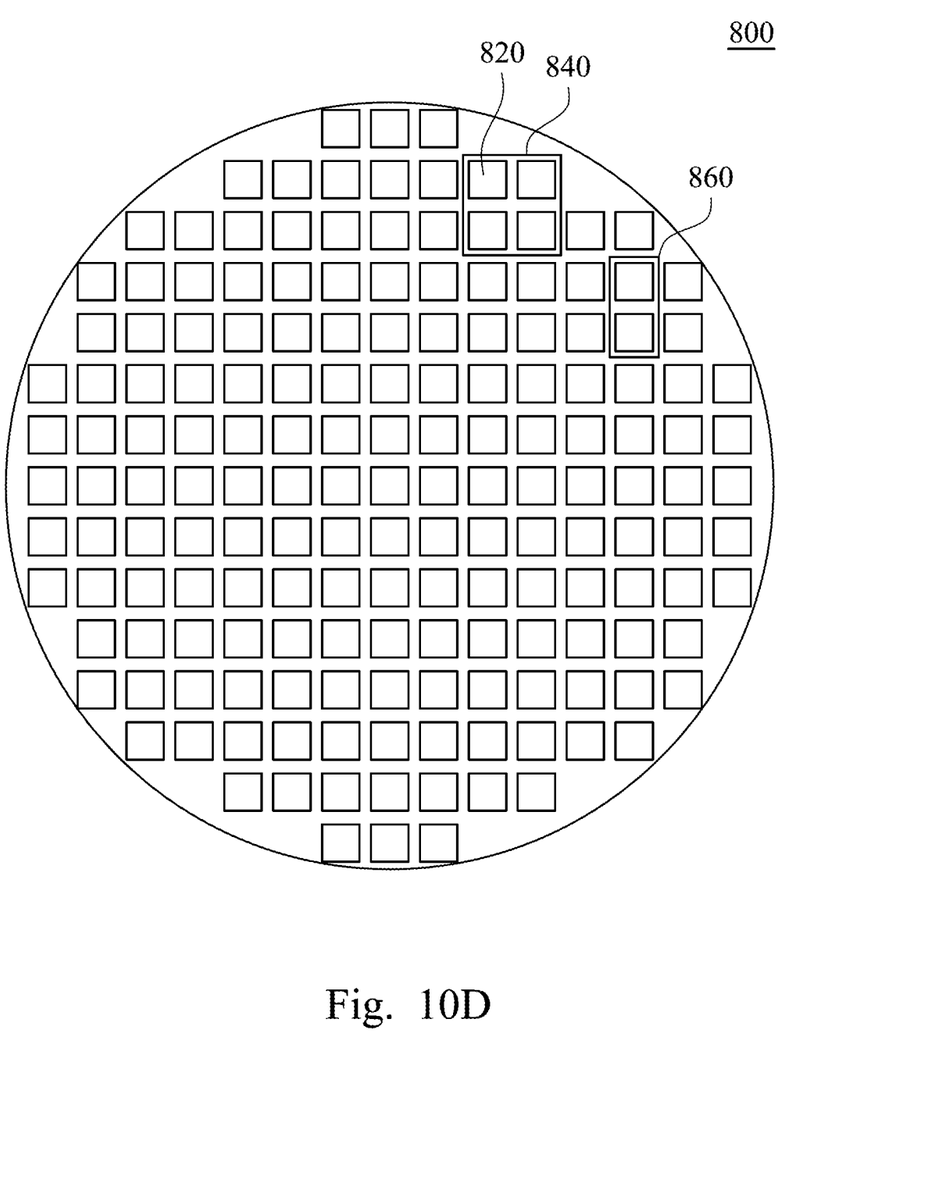

Referring to FIG. 10D, in some embodiments, the through interposer vias 820 may be square. In some embodiments, the through interposer vias 820 can be equal-sized. In some embodiments, the through interposer vias 820 may form a square-packing unit 840 on the interposer layer 800. In some embodiment, the through interposer vias 820 can be fabricated in the manner that duplicating the square-packing unit 840, and/or repetitive elements 860A repetitively and side by side.

Summarized from the above, an embodiment of the present disclosure provides a method of fabricating semiconductor packages. The method includes providing an interposer layer having a first surface and a second surface opposite to the first surface, in which the interposer layer includes through interposer vias (TIVs) embedded inside, and the through interposer vias extended from the first surface toward the second surface, in which through interposer vias are patterned to form repetitive polygonal-packing units, and part of the through interposer vias can be grouped within at least two distinct said polygonal-packing units; subsequently, forming at least one redistribution layer on the first surface to form terminals on a surface of the redistribution layer away from the interposer layer, in which the terminals are selectively connected to the through interposer vias respectively; and then disposing at least one semiconductor chip on the redistribution layer, wherein the semiconductor chip includes active surfaces electrically connected to the terminals respectively. Owing to the interposer layer includes the through interposer vias adapted to various sizes and spreading locations of the disposed semiconductor devices and bumps, the through interposer vias may provide the interposer layer with a greater compatibility and feasibility for any connection configuration of semiconductor packages.

Another embodiment of the present disclosure provides a semiconductor package including an interposer layer, at least one first redistribution layer, at least one second redistribution layer, at least one semiconductor chip, and electrical bumps. The interposer layer, having a first surface and a second surface opposite to the first surface, includes through interposer vias embedded inside. The through interposer vias are extended from the first surface toward the second surface. Through interposer vias are patterned to form repetitive polygonal-packing units, in which part of the through interposer vias can be grouped within at least two distinct said polygonal-packing units. The first redistribution layer, disposed on the first surface, includes first terminals formed on a surface of the first redistribution layer away from the interposer layer, in which the first terminals are connected to the first through interposer vias respectively. The second redistribution layer, disposed on the second surface, includes second terminals formed on a surface of the second redistribution layer away from the interposer layer, in which second terminals are connected to the first terminals through the first through interposer vias respectively. The semiconductor chip, disposed on the first redistribution layer, has active surfaces. The active surfaces are electrically connected to the first terminals respectively. The electrical bumps are disposed on the second terminals.

Although some embodiments of the present disclosure and their advantages have been described in detail, it should be understood that various changes, substitutions, and alterations can be made herein without departing from the spirit and scope of the disclosure as defined by the appended claims. For example, it will be readily understood by those skilled in the art that many of the features, functions, processes, and materials described herein may be varied while remaining within the scope of the present disclosure. Moreover, the scope of the present application is not intended to be limited to the particular embodiments of the process, machine, fabricate, composition of matter, means, methods, and steps described in the specification. As one of ordinary skill in the art will readily appreciate from the disclosure of the present disclosure, processes, machines, fabricate, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, fabricate, compositions of matter, means, methods, or steps.

What is claimed is:

1. A method for forming semiconductor packages comprising:

providing an interposer layer having a first surface and a second surface opposite to the first surface, wherein the interposer layer comprises M first through interposer vias (TIVs) embedded inside, and said M first through interposer vias extended from the first surface toward the second surface, wherein said M first through interposer vias are patterned to form a plurality of repetitive polygonal-packing units, and each of N of said M first through interposer vias is configured to be grouped within at least two distinct said polygonal-packing units, wherein M and N are integer, and M>N;

forming at least one first redistribution layer on the first surface to form a plurality of first terminals on a surface of the first redistribution layer away from the interposer layer, wherein the plurality of first terminals are selectively connected to the corresponded first through interposer vias respectively; and disposing at least one semiconductor chip on the first redistribution layer, wherein the semiconductor chip comprises an active surface electrically connected to the plurality of first terminals respectively, wherein the interposer layer further comprises a plurality of second through interposer vias embedded inside thereof and extended from the first surface toward the second surface, each of the second through interposer vias is located within a center of a corresponded one of the polygonal-packing units, a first group of the plurality of first terminals is connected to the corresponded first through interposer vias respectively, and a second group of the plurality of first terminals is connected to the corresponded second through interposer vias respectively.

2. The method of claim 1, further comprising:

forming at least one second redistribution layer on the interposer layer from a second surface to form second terminals on a surface of the second redistribution layer away from the interposer layer, wherein the second terminals are configured to be routed to the plurality of first terminals through the first through interposer vias respectively; and disposing electrical bumps on the second terminals respectively.

3. The method of claim 2, further comprising:

thinning the interposer layer from the second surface, to expose ends of the first through interposer vias proximal to the second surface, wherein the exposed ends of the first through interposer vias proximal to the second surface are configured to connect with the corresponded second terminals respectively.

4. The method of claim 2, wherein the first through interposer vias comprise dummy through interposer vias disconnected with the plurality of first terminals and the second terminals, the method further comprises singulating the interposer layer along saw streets trespassing the dummy through interposer vias to form the semiconductor packages.

5. The method of claim 1, wherein the first through interposer vias are substantially equal-sized.

6. The method of claim 1, wherein the first through interposer vias form a plurality of repetitive polygonal-closed-packing units.

7. The method of claim 1, wherein distances from one of the first through interposer vias to the surrounded or closest first through interposer vias are substantially equal.

8. The method of claim 1, wherein the interposer layer further comprises second through interposer vias formed at center of each of the polygonal-packing units.

9. The method of claim 8, wherein the second through interposer vias and the first through interposer vias are equal sized.

10. The method of claim 8, wherein the second through interposer vias and the first through interposer vias have distinct diameters respectively.

* * * * *